US007813777B2

(12) United States Patent
Boire

(10) Patent No.: US 7,813,777 B2
(45) Date of Patent: Oct. 12, 2010

(54) ANTENNA TUNER WITH ZERO VOLTS IMPEDANCE FOLD BACK

(75) Inventor: Daniel Boire, Nashua, NH (US)

(73) Assignee: Paratek Microwave, Inc., Nashua, NH (US)

( * ) Notice: Subject to any disclaimer, the term of this patent is extended or adjusted under 35 U.S.C. 154(b) by 729 days.

(21) Appl. No.: 11/637,529

(22) Filed: Dec. 12, 2006

(65) Prior Publication Data

US 2008/0136714 A1 Jun. 12, 2008

(51) Int. Cl.
*H04M 1/00* (2006.01)

(52) U.S. Cl. .................... 455/575.7; 455/82; 455/562.1; 343/745

(58) Field of Classification Search .................... 455/79, 455/82, 560, 562.1, 575.1, 575.7; 343/745
See application file for complete search history.

(56) References Cited

U.S. PATENT DOCUMENTS

| | | | |
|---|---|---|---|
| 2,745,067 A | 5/1956 | True |
| 3,117,279 A | 1/1964 | Ludvigson |
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,493,112 A | 1/1985 | Bruene |
| 4,799,066 A | 1/1989 | Deacon |
| 5,032,805 A | 7/1991 | Elmer |
| 5,694,134 A | 12/1997 | Barnes |
| 5,699,071 A | 12/1997 | Urakami |
| 5,766,697 A | 6/1998 | Sengupta |
| 5,786,727 A | 7/1998 | Sigmon |
| 5,830,591 A | 11/1998 | Sengupta |
| 5,846,893 A | 12/1998 | Sengupta |
| 5,874,926 A | 2/1999 | Tsuru |
| 5,886,867 A | 3/1999 | Chivukula |
| 5,990,766 A | 11/1999 | Zhang |
| 6,009,124 A | 12/1999 | Smith |
| 6,020,787 A | 2/2000 | Kim |
| 6,029,075 A | 2/2000 | Das |
| 6,045,932 A | 4/2000 | Jia |
| 6,061,025 A | 5/2000 | Jackson |

(Continued)

FOREIGN PATENT DOCUMENTS

EP          0909024          12/1999

(Continued)

*Primary Examiner*—Nhan Le
(74) *Attorney, Agent, or Firm*—Andrew Gust; Ed Guntin; Guntin Meles & Gust, PLC

(57) ABSTRACT

An embodiment of the present invention provides an apparatus, comprising a wireless handset and an antenna tuner within the wireless handset that is adapted to preset its impedance to the transmit/receive circuitry in the handset.

13 Claims, 4 Drawing Sheets

U.S. PATENT DOCUMENTS

| | | | |
|---|---|---|---|
| 6,074,971 A | 6/2000 | Chiu | |
| 6,096,127 A | 8/2000 | Dimos | |
| 6,100,733 A | 8/2000 | Dortu | |
| 6,101,102 A | 8/2000 | Brand | |
| 6,133,883 A | 10/2000 | Munson | |
| 6,590,468 B2 | 2/2002 | Cornelius | |
| 6,377,142 B1 | 4/2002 | Chiu | |
| 6,404,614 B1 | 6/2002 | Zhu | |
| 6,414,562 B1 | 7/2002 | Bouisse | |
| 6,466,774 B1 | 10/2002 | Okabe | |
| 6,765,540 B2 | 10/2002 | Toncich | |
| 6,859,104 B2 | 10/2002 | Toncich | |
| 6,825,818 B2 | 11/2002 | Toncich | |
| 6,492,883 B2 | 12/2002 | Liang | |
| 6,514,895 B1 | 2/2003 | Chiu | |
| 6,525,630 B1 | 2/2003 | Zhu | |
| 6,531,936 B1 | 3/2003 | Chiu | |
| 6,535,076 B2 | 3/2003 | Patridge | |
| 6,556,102 B1 | 4/2003 | Sengupta | |
| 6,710,651 B2 | 4/2003 | Forrester | |
| 6,570,462 B2 | 5/2003 | Edmonson | |
| 6,590,541 B1 * | 7/2003 | Schultze | 343/741 |
| 6,597,265 B2 | 7/2003 | Liang | |
| 6,759,918 B2 | 11/2003 | Du Toit | |
| 6,864,757 B2 | 11/2003 | Du Toit | |
| 6,657,595 B1 * | 12/2003 | Phillips et al. | 343/702 |
| 6,737,179 B2 | 5/2004 | Sengupta | |
| 6,538,603 B1 | 7/2004 | Chen | |
| 6,774,077 B2 | 8/2004 | Sengupta | |
| 6,795,712 B1 | 9/2004 | Vakilian | |
| 7,009,455 B2 | 9/2004 | Toncich | |
| 7,180,467 B2 | 12/2004 | Fabrega-Sanchez | |
| 6,845,126 B2 | 1/2005 | Dent | |
| 7,176,845 B2 | 1/2005 | Fabrega-Sanchez | |
| 6,377,217 B1 | 3/2005 | Zhu | |
| 6,862,432 B1 | 3/2005 | Kim | |
| 6,868,260 B2 | 3/2005 | Jagielski | |
| 6,377,440 B1 | 4/2005 | Zhu | |
| 7,071,776 B2 | 5/2005 | Forrester | |
| 7,221,327 B2 | 5/2005 | Toncich | |
| 6,905,989 B2 | 6/2005 | Ellis | |
| 6,907,234 B2 | 6/2005 | Karr | |
| 6,920,315 B1 | 7/2005 | Wilcox | |
| 6,961,368 B2 | 11/2005 | Dent | |
| 6,965,837 B2 | 11/2005 | Vintola | |
| 6,993,297 B2 | 1/2006 | Smith | |
| 7,113,614 B2 | 9/2006 | Rhoads | |
| 7,151,411 B2 | 12/2006 | Martin | |
| 7,339,527 B2 | 3/2008 | Sager | |
| 7,426,373 B2 | 9/2008 | Clingman | |
| 2002/0191703 A1 | 12/2002 | Ling | |
| 2002/0193088 A1 | 12/2002 | Jung | |
| 2003/0232607 A1 | 12/2003 | Le Bars | |
| 2004/0009754 A1 | 1/2004 | Edward | |
| 2004/0137950 A1 | 7/2004 | Bolin | |
| 2004/0202399 A1 | 10/2004 | Kochergin | |
| 2004/0257293 A1 * | 12/2004 | Friedrich et al. | 343/860 |
| 2005/0042994 A1 | 2/2005 | Otaka | |
| 2005/0093624 A1 | 5/2005 | Forrester | |
| 2005/0215204 A1 | 9/2005 | Wallace | |
| 2005/0282503 A1 | 12/2005 | Onno | |
| 2006/0183442 A1 | 8/2006 | Chang | |
| 2006/0281423 A1 | 12/2006 | Caimi | |
| 2007/0013483 A1 | 1/2007 | Stewart | |
| 2007/0042734 A1 | 2/2007 | Ryu | |
| 2007/0080888 A1 | 4/2007 | Mohamadi | |
| 2007/0197180 A1 | 8/2007 | McKinzie, III | |
| 2008/0055016 A1 | 3/2008 | Morris | |

FOREIGN PATENT DOCUMENTS

| | | |
|---|---|---|
| JP | 03276901 | 8/1998 |
| JP | 10209722 | 8/1998 |

* cited by examiner

ANTENNA TUNER WITH ZERO VOLTS IMPEDANCE FOLD BACK

BACKGROUND OF THE INVENTION

Antenna tuners can be used to extend the battery life and/or quality of service under adverse conditions by correcting for mismatches at the antenna. Modern cellular telephone handsets are optimized to provide long battery life while in standby mode. Typically, the handset does not transmit in standby mode.

Without bias applied, the impedance point generated by a prior art antenna tuner is not generally near the impedance expected by the transmit/receive circuitry in the handset. This detunes these circuits and results lower quality of service for the handset. Another undesirable option is to continually bias the antenna tuner at the expense of decreased battery life. Thus, there is a strong need for an antenna tuner topology that has minimal impact on performance of the handset in a passive state and would extend handset battery life by not needing its bias voltages generated to provide acceptable service in standby mode.

SUMMARY OF THE INVENTION

An embodiment of the present invention provides an apparatus, comprising a wireless handset and an antenna tuner within the wireless handset that is adapted to preset its impedance to the transmit/receive circuitry in the handset. In an embodiment of the present invention the preset impedance may be 50 ohms and the when the apparatus is in a passive state there may be minimal impact on performance and extend handset battery life by not needing its bias voltages generated to provide acceptable service in a standby mode. Further, with voltages applied, the antenna tuner may correct for mismatches at an antenna to improve current draw and performance of the transmit/receive circuitry. In an embodiment of the present invention the voltage tunable dielectric varactors enable impedance variation with applied voltages.

Still another embodiment of the present invention provides an antenna tuner, comprising a circuit operable in a wireless handset and comprising tunable varactors and wherein the circuit is adapted to preset its impedance to the transmit/receive circuitry in the handset. In an embodiment of the present invention, the tunable varactors may be voltage tunable dielectric varactors.

Yet another embodiment of the present invention provides a method, comprising using an antenna tuner within a wireless handset, the antenna tuner set to a preset impedance equal to the transmit/receive circuitry in the handset. This embodiment may further comprise setting the preset impedance to 50 ohms and correcting for mismatches at an antenna to improve current draw and performance of the transmit/receive circuitry.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
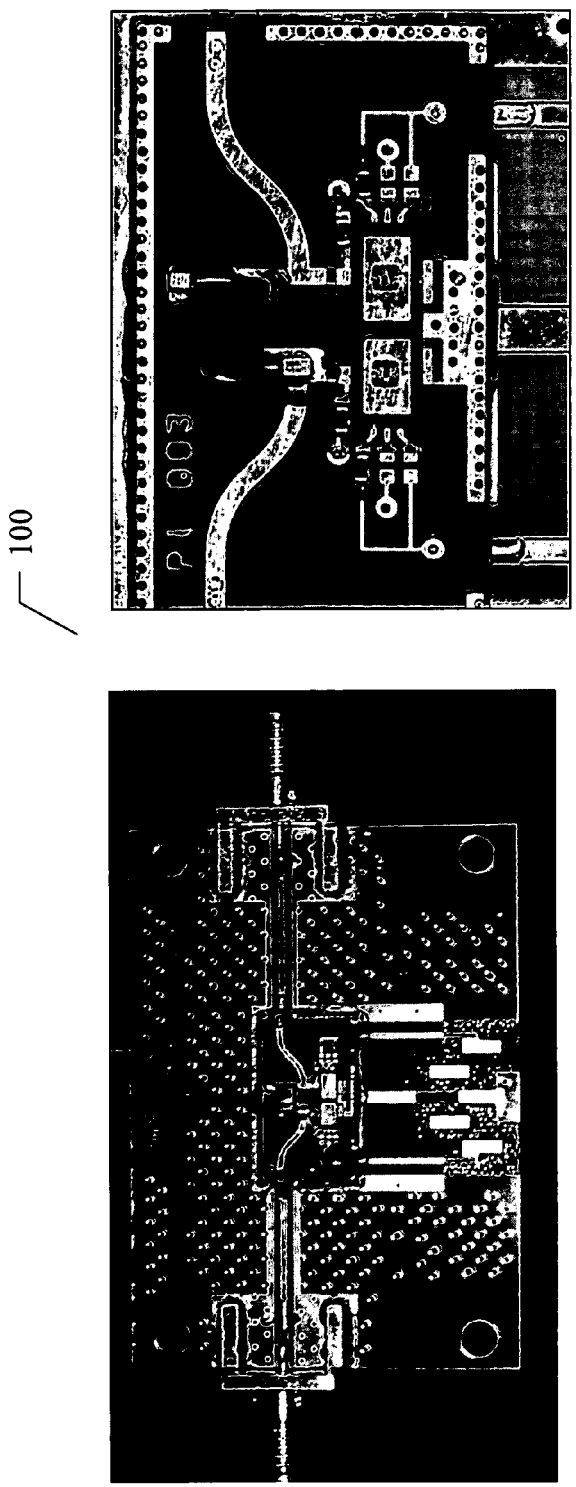
FIG. 1 illustrates a prior art antenna tuner.
Figure 1:
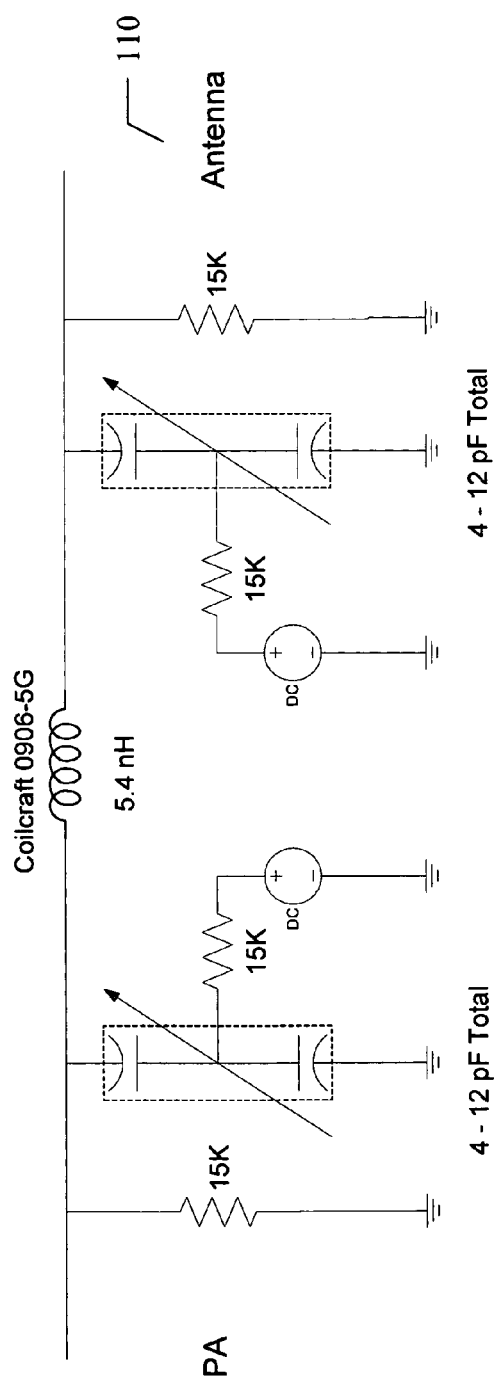

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

Figure 2:
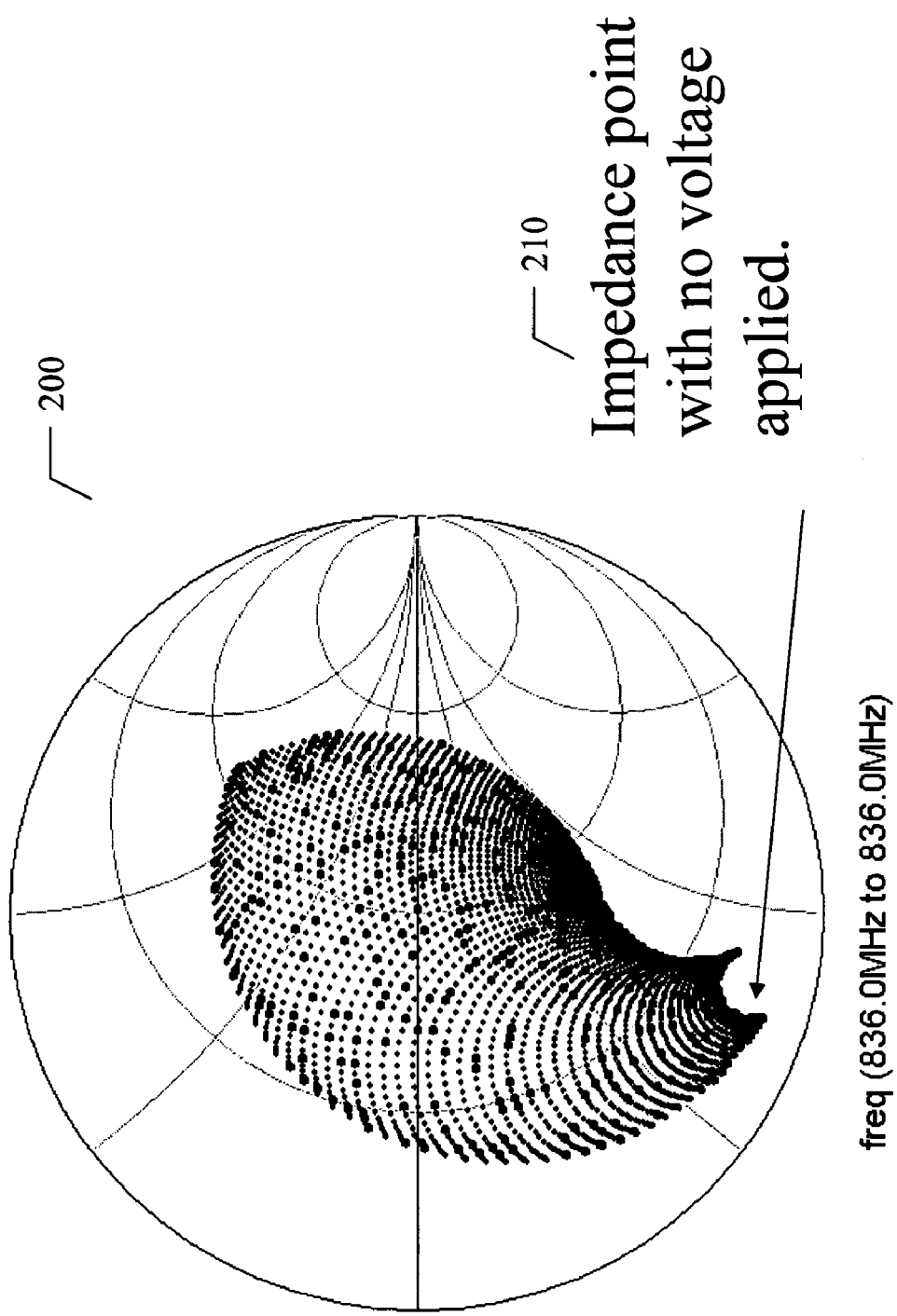
FIG. 2 graphically depicts the impedances generated by a typical prior art antenna tuner.

An embodiment of the present invention provides a circuit for a tunable antenna tuner that has minimal impact on circuit performance when it is turned off and is consuming no power. Antenna tuners can be used to extend the battery life and/or quality of service under adverse conditions by correcting for mismatches at the antenna. Modern cellular telephone handsets are optimized to provide long battery life while in standby mode. Typically, the handset does not transmit in standby mode. An antenna tuner topology that has minimal impact on performance of the handset in a passive state would extend handset battery life by not needing its bias voltages generated to provide acceptable service in standby mode Turning now to the figures, FIG. 1, shown generally as 100, illustrates a prior art antenna tuner 110 with antenna circuit 120 of antenna 130; and FIG. 2, shown generally as 200, graphically depicts the impedances generated by a typical prior art antenna tuner with the impedance point with no voltage applied shown at 210. Impedances generated near the edge of the Smith chart 200 by the tuner 110 can be used to correct for more severe antenna mismatches. Without bias applied, the impedance point generated by the tuner 110 in the passive, no bias applied case is not near the nominal 50 ohms expected by the transmit/receive circuitry in the handset. This detunes these circuits and results in lower quality of service for the handset. Another undesirable option is to continually bias the antenna tuner at the expense of decreased battery life.

Figure 3:
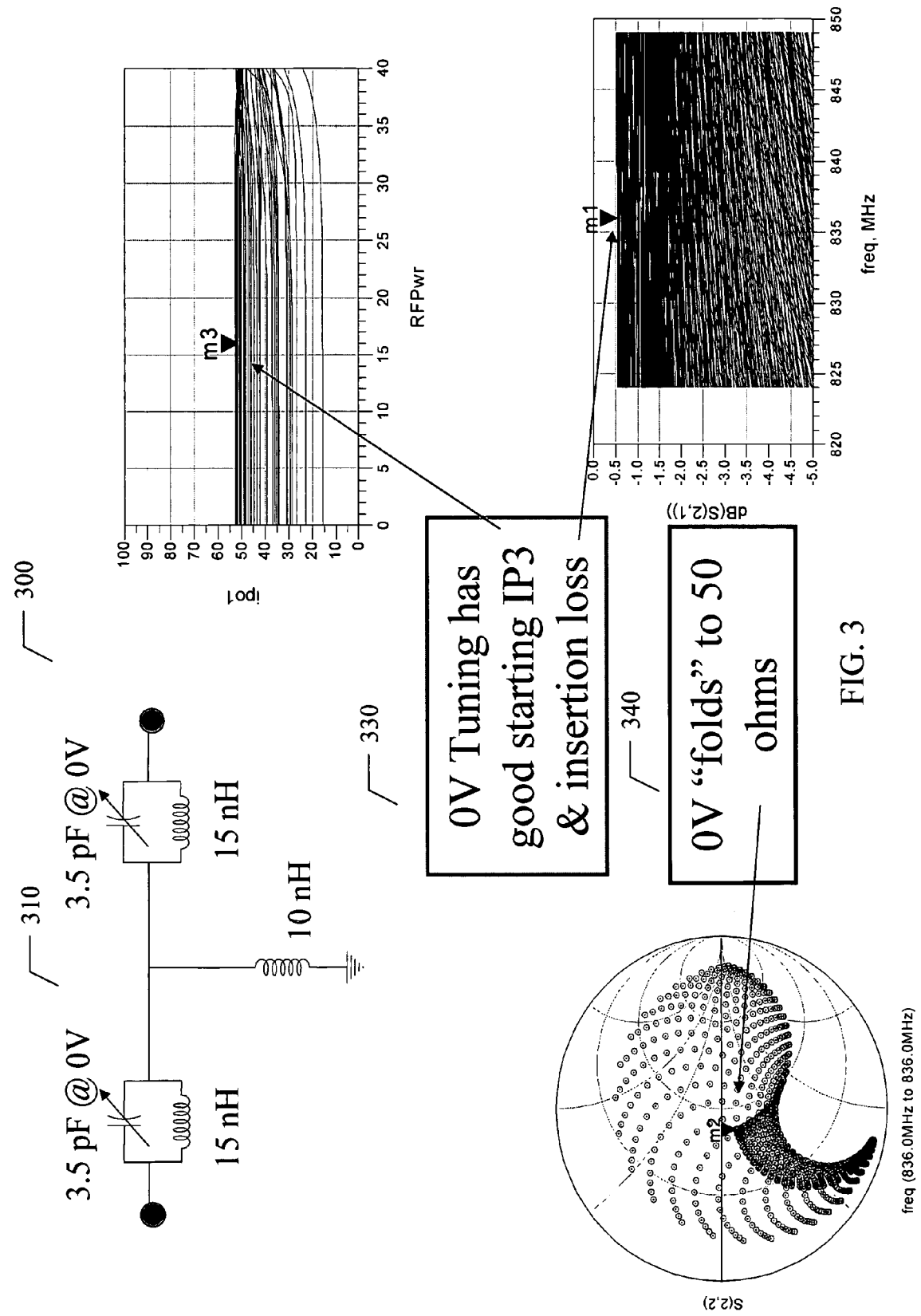
FIG. 3 illustrates an adaptive impedance matching module (AIMM) circuit with zero volts foldback of one embodiment of the present invention.

Looking now at FIG. 3, illustrated generally at 300 is an adaptive impedance matching module (AIMM) circuit 310 with zero volts foldback. As shown in FIG. 3, an embodiment of the present invention provides an antenna tuner topology that improves the condition where no bias is applied. The combination of voltage biases applied to the voltage variable capacitors (shown at 330) presents the impedances shown at 340 to the transmit/receive circuitry in the handset. These changeable impedances can be used to correct for mismatches at the antenna. Because the transmit/receive circuitry within the handset is sensitive to impedance mismatches, better handset performance is realized when the antenna tuner corrects for antenna mismatches. In an embodiment of the present invention, when not in use, the handset incurs no DC power penalty, and performance is not significantly degraded compared to the case without the antenna tuner.

An important aspect of the present invention is that the impedance coverage is the return to a preset impedance set to the transmit/receive circuitry in a handset. For example, but not limited in this respect, the preset impedance may typically be approximately 50 ohms when no bias is applied. With voltages applied, the antenna tuner network may correct for mismatches at the antenna to improve current draw and performance of the transmit/receive circuitry. Potentially circuit topologies other than the one presented may be used in a similar way to provide good impedance coverage and good passive performance.

Figure 4:
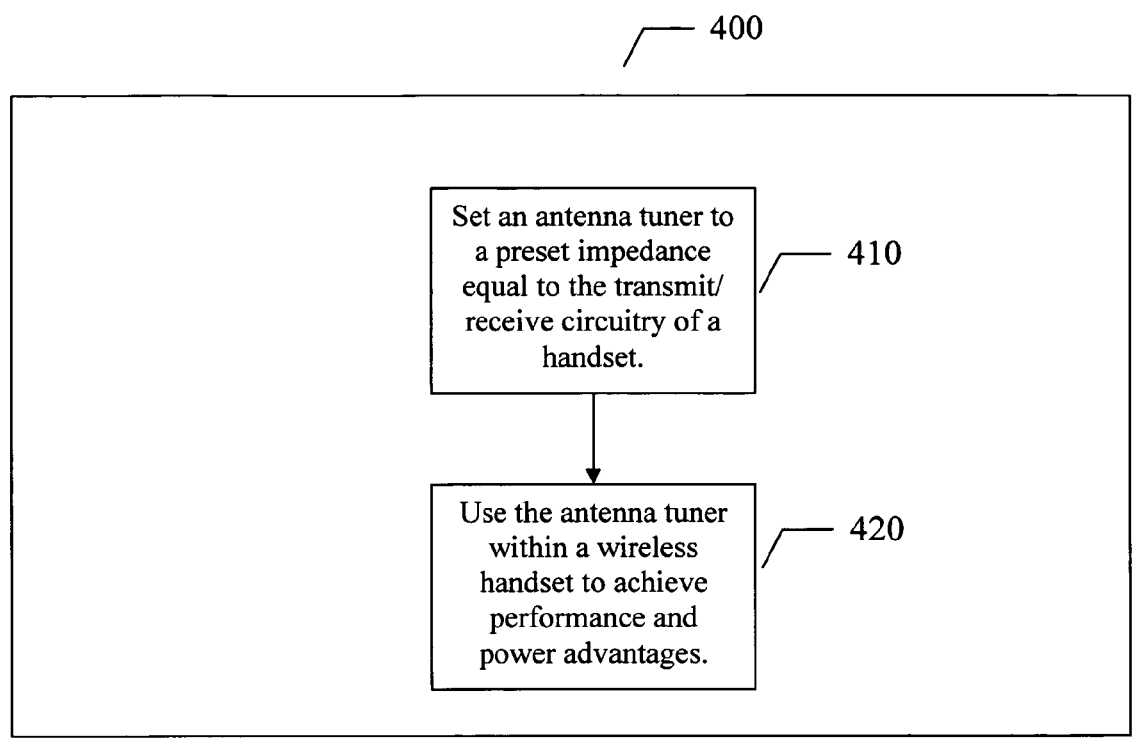
FIG. 4 illustrates a method according to one embodiment of the present invention.

FIG. 4 provides another embodiment of the present invention depicting a flowchart of a method, comprising using an antenna tuner within a wireless handset 420, the antenna tuner set to a preset impedance equal to the transmit/receive circuitry in said handset 410. The embodiment may further comprise setting the preset impedance to 50 ohms and correcting for mismatches at an antenna to improve current draw and performance of the transmit/receive circuitry.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. An apparatus, comprising:
a wireless handset having transmit/receive circuitry and an antenna; and
an antenna tuner comprising a plurality of tunable capacitors and being within said wireless handset, the antenna tuner being adapted to preset its impedance to match an impedance of the transmit/receive circuitry in said handset when there is no voltage bias applied to the antenna tuner, wherein the tunable capacitors correct for impedance mismatches at the antenna when a tuning voltage is applied, and wherein the antenna tuner returns to its preset impedance when the tuning voltage is removed.

2. The apparatus of claim 1, wherein the preset impedance is 50 ohms.

3. An antenna tuner, comprising:
a circuit operable in a wireless handset and comprising tunable varactors; and
wherein said circuit is adapted to preset its impedance to match an impedance of the transmit/receive circuitry in said handset, the preset impedance matching the impedance of the transmit/receive circuitry in said handset when there is no bias applied to the antenna tuner, wherein the tunable varactors correct for impedance mismatches at an antenna of the handset when a tuning bias is applied, and wherein the circuit returns to its preset impedance when the tuning bias is removed.

4. The antenna tuner of claim 3, wherein said tunable varactors are voltage tunable dielectric varactors.

5. The antenna tuner of claim 3, wherein preset impedance is 50 ohms.

6. A method, comprising:
using an antenna tuner within a wireless handset, said antenna tuner set to a preset impedance equal to an impedance of the transmit/receive circuitry in said handset when there is no voltage bias applied to the antenna tuner, wherein the antenna tuner has a plurality of tunable capacitors that correct for impedance mismatches at an antenna of the handset when a tuning voltage is applied, and wherein the antenna tuner returns to its preset impedance when the tuning voltage is removed.

7. The method of claim 6, further comprising setting said preset impedance to 50 ohms.

8. An antenna tuner, comprising:
a tunable reactance circuit configured to be operable in a wireless handset and comprising one or more elements, wherein said circuit is adapted to preset its impedance to match an impedance of the transmit/receive circuitry in said handset, the preset impedance matching the impedance of the transmit/receive circuitry in said handset when there is no bias applied to the antenna tuner, wherein the tunable reactance circuit corrects for impedance mismatches at an antenna of the handset when a tuning bias is applied, and wherein the circuit returns to its preset impedance when the tuning bias is removed.

9. The antenna tuner of claim 8, wherein the element is a tunable varactor.

10. The antenna tuner of claim 9, wherein the tunable varactor is a voltage tunable dielectric varactor.

11. The antenna tuner of claim 8, wherein the element comprises a plurality of capacitors.

12. The antenna tuner of claim 8, wherein the element comprises a plurality of inductors.

13. The antenna tuner of claim 8, wherein the element comprises a plurality of capacitors and a plurality of inductors.

* * * * *